United States Patent
Stimson et al.

(10) Patent No.: US 8,298,625 B2
(45) Date of Patent: Oct. 30, 2012

(54) MULTIPLE PHASE RF POWER FOR ELECTRODE OF PLASMA CHAMBER

(75) Inventors: Bradley O. Stimson, Monte Sereno, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 742 days.

(21) Appl. No.: 12/363,760

(22) Filed: Jan. 31, 2009

(65) Prior Publication Data

US 2009/0202741 A1     Aug. 13, 2009

Related U.S. Application Data

(60) Provisional application No. 61/025,111, filed on Jan. 31, 2008.

(51) Int. Cl.
    *H05H 1/24*     (2006.01)
    *C23C 16/00*     (2006.01)
    *C23F 1/00*     (2006.01)
    *H01J 7/24*     (2006.01)

(52) U.S. Cl. ............... 427/569; 118/723 E; 156/345.43; 156/345.44; 315/111.21

(58) Field of Classification Search .................. 427/569, 427/571, 573, 574, 576, 577, 578, 579; 118/723 E; 156/345.45, 345.46, 345.47, 345.43, 345.44; 315/111.21
See application file for complete search history.

(56) References Cited

U.S. PATENT DOCUMENTS

| | | |
|---|---|---|
| 5,252,178 A | 10/1993 | Moslehi |
| 5,272,417 A | 12/1993 | Ohmi |
| 5,573,595 A | 11/1996 | Dible |
| 5,733,511 A | 3/1998 | De Francesco |
| 5,882,411 A | 3/1999 | Zhao |
| 6,079,356 A | 6/2000 | Umotoy |
| 6,228,229 B1 | 5/2001 | Raaijmakers |
| 6,254,738 B1 | 7/2001 | Stimson |
| 6,353,201 B1 | 3/2002 | Yamakoshi |
| 6,359,250 B1 | 3/2002 | Blonigan |
| 6,422,172 B1 | 7/2002 | Takaka et al. |
| 6,456,010 B2 | 9/2002 | Yamakoshi |
| 6,477,980 B1 | 11/2002 | White |
| 6,552,297 B2 | 4/2003 | Blonigan |
| 6,620,290 B2 | 9/2003 | Yamamoto |

(Continued)

FOREIGN PATENT DOCUMENTS

DE     4242894 A1     6/1994

(Continued)

OTHER PUBLICATIONS

U.S. Appl. No. 61/246,535, filed Sep. 29, 2009, Baek.

(Continued)

*Primary Examiner* — Dah-Wei Yuan
*Assistant Examiner* — Nga Leung V Law
(74) *Attorney, Agent, or Firm* — Robert J. Stern

(57) ABSTRACT

RF power is coupled with different phase offsets to different RF connection points on an electrode of a plasma chamber. Preferably, the number of different RF connection points and corresponding phase offsets is at least four, and the positions of the RF connection points are distributed along two orthogonal dimensions of the electrode. Preferably, power to each respective RF connection point is supplied by a respective RF power supply, wherein each power supply synchronizes its phase to a common reference RF oscillator.

12 Claims, 3 Drawing Sheets

U.S. PATENT DOCUMENTS

| | | | |
|---|---|---|---|
| 6,824,658 | B2 | 11/2004 | Gopalraja |
| 6,827,815 | B2 | 12/2004 | Hytros |
| 6,863,020 | B2 | 3/2005 | Mitrovic |
| 6,884,635 | B2 | 4/2005 | Parsons |
| 6,916,401 | B2 | 7/2005 | Long |
| 7,141,516 | B2 | 11/2006 | Kawamura |
| 7,153,387 | B1 | 12/2006 | Tomoyasu |
| 7,164,236 | B2 | 1/2007 | Mitrovic |
| 7,205,034 | B2 | 4/2007 | Kawamura |
| 7,270,713 | B2 | 9/2007 | Blonigan |
| 2004/0194709 | A1 | 10/2004 | Yamagishi |
| 2005/0183827 | A1* | 8/2005 | White et al. ............ 156/345.34 |
| 2006/0049138 | A1 | 3/2006 | Miyake |
| 2006/0105114 | A1 | 5/2006 | White |
| 2008/0274297 | A1 | 11/2008 | Furuta |
| 2009/0159423 | A1 | 6/2009 | Kudela |
| 2009/0202741 | A1 | 8/2009 | Stimson |

FOREIGN PATENT DOCUMENTS

| | | |
|---|---|---|
| JP | 08-236294 A | 9/1996 |
| JP | 2002-260899 A | 9/2002 |
| KR | 10-0498584 B1 | 11/2005 |

OTHER PUBLICATIONS

U.S. Appl. No. 61/252,672, filed Oct. 17, 2009, Baek.

"Written opinion of the international searching authority" mailed Apr. 13, 2010 (6 pages) for PCT application No. PCT/US2009/032776, which has the same specification and drawings as the present application.

"Written opinion of the international searching authority" mailed Jul. 30, 2009 (6 pages) for PCT application No. PCT/US2008/088265.

"International Search Report" mailed Jul. 30, 2009 (2 pages) for PCT application No. PCT/US2008/088265.

"Written opinion of the international searching authority" mailed Jul. 30, 2009 (6 pages) for PCT application No. PCT/US2008/088265, which has the same specification and drawings as the present application.

"International Search Report" mailed Jul. 30, 2009 (2 pages) for PCT application No. PCT/US2008/088265, which has the same specification and drawings as the present application.

M.A. Lieberman et al., "Standing wave and skin effects in large-area, high-frequency capacitive discharges", Plasma Sources Sci. Technol., vol. 11, pp. 283-293, 2002, UK.

* cited by examiner

MULTIPLE PHASE RF POWER FOR ELECTRODE OF PLASMA CHAMBER

CROSS REFERENCE TO RELATED APPLICATION

This patent application claims the benefit of U.S. Provisional Application No. 61/025,111 filed Jan. 31, 2008.

FIELD OF THE INVENTION

The invention relates generally to coupling RF power to an electrode of a plasma chamber used for fabricating electronic devices such as semiconductors, displays, solar cells, and solid state light emitting devices. The invention relates more specifically to improving the uniformity of a plasma process performed in the chamber by coupling RF power with different phase offsets to different points on the electrode.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

It is important for a plasma fabrication process to be performed with high spatial uniformity over the surface of the workpiece. For example, a deposition process should be performed so that the deposited material has uniform thickness and quality at all positions on the surface of the workpiece. Likewise, an etch process should etch material at a uniform rate at all such positions.

RF power can be capacitively coupled to plasma within a plasma chamber by coupling a source of RF power to an electrode positioned within, or adjacent to, the plasma chamber. In designs in which the RF power is coupled to a single point on the electrode, the plasma density, and hence the plasma fabrication process being performed on the workpiece, will suffer spatial non-uniformity if any dimension of the electrode is greater than approximately one-quarter wavelength of the RF power. Therefore, a need exists for improving such spatial uniformity.

SUMMARY OF THE INVENTION

In one aspect, the present invention couples RF power with different phase offsets to different RF connection points on an electrode of a plasma chamber. In another aspect, the invention couples RF power with adjustable respective phase offsets to different RF connection points on an electrode of a plasma chamber The respective values of the phase offsets can be established to optimize the spatial uniformity of a plasma process performed in the chamber. For example, the respective phase offsets can be established such that, in a region of the plasma chamber between the workpiece and the electrode, the plasma has a lower spatial non-uniformity than a plasma that would have been produced by each said phase offset being zero. Alternatively, in performing a plasma process so as to form or modify a layer of material on the workpiece, the respective phase offsets can be established such that a physical characteristic of said layer of material has a lower spatial non-uniformity than said physical characteristic of said layer of material that would have resulted from each said phase offset being zero.

Preferably, the number of different RF connection points and corresponding phase offsets is at least four, and the positions of the RF connection points are distributed along two orthogonal dimensions (for example, X and Y axes) of the electrode. This feature enables optimization of the spatial uniformity of the plasma process in two spatial dimensions, which is especially valuable when workpiece being processed in the chamber is rectangular.

In a preferred embodiment, power to each respective RF connection point is supplied by a respective RF power supply, wherein each power supply synchronizes its phase to a common reference RF oscillator.

Throughout this patent specification and claims, we use the term "RF connection point" to mean a position on an electrode at which RF power is electrically connected to the electrode.

DETAILED DESCRIPTION OF THE PREFERRED EMBODIMENTS

Figure 1:
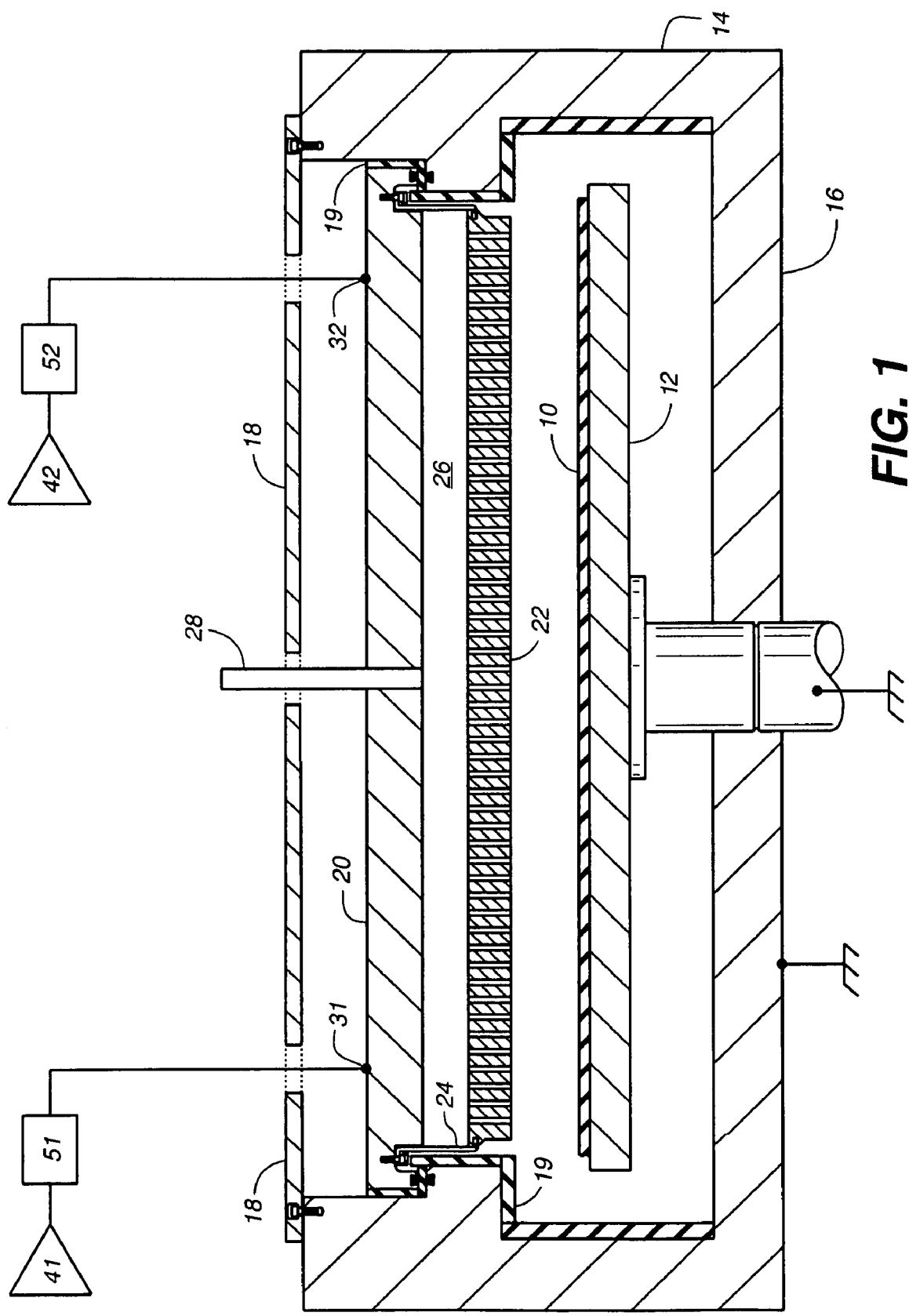
FIG. 1 is a partially schematic, sectional side view of a plasma chamber according to the invention. The section is taken through two of the four RF connection points.
Figure 2:
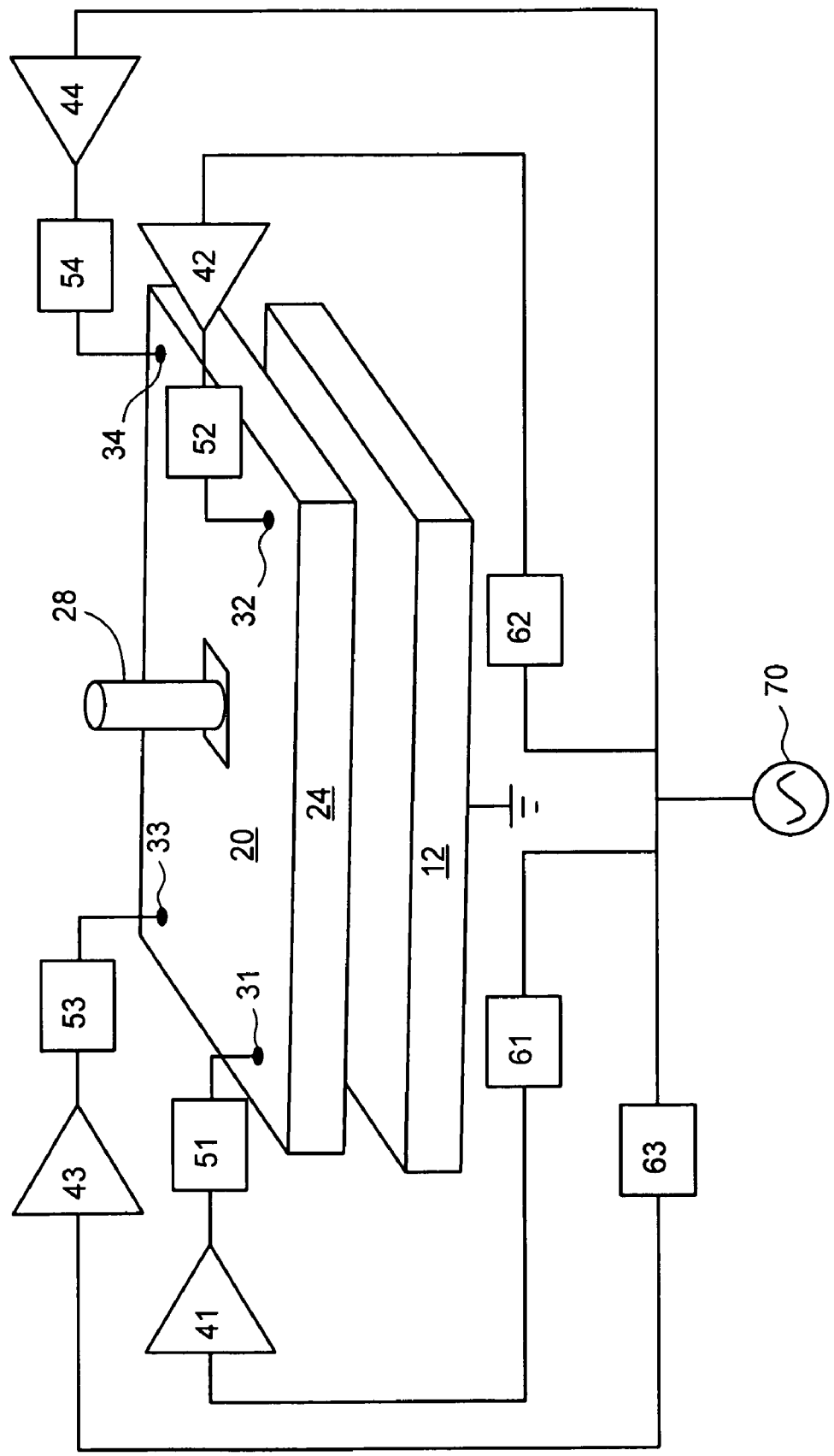
FIG. 2 is a schematic drawing of the RF power supplies connected to the plasma chamber of FIG. 1.

FIGS. 1 and 2 show a plasma chamber according to one embodiment of the invention.

Referring to FIG. 1, a workpiece 10 is supported on a susceptor 12 within the plasma chamber. The plasma chamber is intended to subject the workpiece to a plasma process step for fabricating on the workpiece electronic devices such as semiconductor devices, displays, solar cells, or solid state light emitting devices. Examples of a workpiece 10 that would be processed within the plasma chamber include a rectangular glass substrate on which flat panel displays are fabricated or a circular semiconductor wafer on which integrated circuits are fabricated.

The plasma chamber has an electrically conductive chamber wall 14-18, preferably aluminum, that provides a vacuum enclosure for the chamber interior. In the illustrated embodiment, the chamber side wall 14 and chamber bottom wall 16 are implemented as a unitary wall. The chamber wall also includes a top wall 18. All portions of the chamber wall are connected together electrically and are electrically grounded.

In performing a plasma process on the workpiece, one or more process gases are dispensed into the chamber through a gas inlet manifold 20-26. The gas inlet manifold includes a manifold back wall 20, a showerhead 22 (also called a gas distribution plate or diffusor), and a suspension 24, all of which collectively enclose a volume which constitutes the interior 28 of the gas inlet manifold.

A gas inlet conduit 26 extends through the center of the manifold back wall 20. A gas source, not shown, supplies process gases to the upper end of the gas inlet conduit. The process gases flow from the gas inlet conduit into the interior 28 of the gas inlet manifold, and then are dispensed into the plasma chamber through numerous openings in the showerhead 22.

The weight of the showerhead is supported by the suspension 24, which is supported by the gas inlet manifold back wall 20, which is supported by the chamber side wall 14. The suspension 24 preferably is flexible so as to accommodate radial expansion and contraction of the showerhead as the temperature of the showerhead rises and falls. The suspension 24 has an upper end attached to the gas inlet manifold back wall 20 and a lower end attached to the rim at the periphery of the showerhead 22. The latter attachment can be either fixed or sliding. For example, a sliding attachment can be implemented by resting the showerhead rim on the lower end of the suspension.

If the showerhead is rectangular as in the illustrated embodiment, the vertically extending portion of the suspension 24 preferably consists of four flexible sheets respectively attached to the four sides of the rectangular showerhead 22. Each sheet extends vertically between one side of the rectangular showerhead and a corresponding side of the rectangular back wall 20.

The gas inlet manifold 20-26 also functions as an electrode to couple RF power to the plasma within the chamber. The manifold back wall 20, showerhead 22 and suspension 24 are electrically conductive, preferably aluminum. Dielectric liners 19 electrically and mechanically separate the RF powered components 20-24 of the gas inlet manifold from the electrically grounded chamber wall 14-18.

Referring to FIG. 2, the respective outputs of a plurality of RF power supplies 41-44 are connected through respective impedance matching networks 51-54 to respective RF connection points 31-34 on the rear surface of the manifold back wall 20. (FIG. 2 shows all four RF power supplies, matching networks, and RF connection points. FIG. 1 only shows two of each because FIG. 1 is a sectional view taken at a vertical plane that intersects the first two RF connection points 31, 32.)

As stated in the Summary of the Invention, we use the term "RF connection point" to mean a position on an electrode at which RF power is connected to the electrode.

Although the electrode in the illustrated embodiment is a gas inlet manifold 20-26, the scope of invention includes RF connection points on any conventional plasma chamber electrode, regardless of whether the electrode has a gas distribution function. In other words, the electrode need not be part of a gas inlet manifold and need not include a showerhead.

Furthermore, the electrode can be outside the chamber wall 14-18 if it is adjacent a portion of the chamber wall that is dielectric, thereby permitting RF power to be capacitively coupled from the electrode to the plasma within the chamber. Because the electrode can be inside or outside the chamber wall, the electrode is described herein as an electrode "of" the chamber rather than an electrode "in" the chamber.

RF power flows from the outputs of the respective RF power supplies 41-44 to the respective RF connection points 31-34 on the manifold back wall 20, then through the manifold back wall to the four suspension walls 24 at the four sides of the manifold back wall, then through the four suspension walls to the four sides of the showerhead 22. The RF power is coupled from the showerhead to a plasma between the showerhead and the susceptor.

A novel feature of the invention is that each of the RF power supplies 41-44 produces at its output an RF signal having the same frequency, but having a relative phase offset that can be set to a different value for each RF power supply. In the embodiment of FIG. 2, this is implemented as follows. Each RF power supply 41-44 has a conventional RF power supply of the type that has a sync input. Each RF power supply produces at its output a high power RF signal that is synchronized in frequency and phase to the low power RF signal received at its sync input.

A reference oscillator 70 produces a low power RF signal at the frequency that is desired to be supplied to the plasma chamber electrode (gas inlet manifold 20-26). The output of the reference oscillator is connected to the respective inputs of a number of conventional phase shifters 61-63. Each phase shifter 61-63 produces an output signal that is shifted in phase by a predetermined phase angle relative to the signal received at its input. The output of each respective phase shifter 61-63 is connected to the sync input of the respective RF power supply.

The number of phase shifters can equal the number of RF power supplies, in which case the sync input of each respective RF power supply is connected to the output of each respective phase shifter. More preferably, the number of phase shifters is one less than the number of RF power supplies, in which case the sync input of one RF power supply 64 is connected directly to the output of the reference oscillator 70.

The spatial distribution of the electromagnetic field produced by the electrode (gas inlet manifold 20-26) in response to the power from the four RF power supplies 61-64 is determined by the phase offsets of the RF power supplies relative to each other, but the absolute phase of the four RF power supplies relative to the reference oscillator 70 is unimportant. Therefore, one RF power supply 64 can function as a reference in relation to which the phases of the other RF power supplies 61-63 are relative. This can be accomplished by connecting the sync input of one RF power supply 64 directly to the reference oscillator 70 without an intervening phase shifter, in which case the output of that power supply 64 will be in phase with the reference oscillator.

The value of the phase shift produced by each phase shifter 61-63 preferably should be adjusted by routine experimentation to optimize the spatial uniformity of a specific plasma fabrication process that will be performed in the plasma chamber. For example, the spatial uniformity of a film deposited or etched on the surface of a workpiece within the plasma chamber can be measured for a succession of workpieces, wherein a different set of values of phase shift for each phase shifter 61-63 is tested for each workpiece. Then, the phase shift values experimentally determined to produce the best spatial uniformity can be used during production fabrication of workpieces without further adjustment of the phase shift values.

More generally, the respective values of the phase offsets can be established to optimize the spatial uniformity of a plasma process performed in the chamber. For example, the respective phase offsets can be established such that, in a region of the plasma chamber between the workpiece and the electrode, the plasma has a lower spatial non-uniformity than a plasma that would have been produced by each said phase offset being zero. Alternatively, in performing a plasma process so as to form or modify a layer of material on the workpiece, the respective phase offsets can be established such that a physical characteristic of said layer of material has a lower spatial non-uniformity than said physical characteristic of said layer of material that would have resulted from each said phase offset being zero.

Adjustable phase shifters are convenient during the initial experimentation described in the second preceding paragraph, but fixed phase shifters can be used in a production plasma chamber after the optimum phase shift values have been determined.

When the RF connection points are on a rectangular electrode, such as the rectangular gas inlet manifold 20-26 in the illustrated embodiment, it is highly advantageous to include at least four RF connection points having different positions relative to both the X and Y axes on the surface of the electrode to which the RF connection points are connected. In the embodiment of FIG. 2, this is accomplished by positioning four RF connection points 31-34 near the four corners of the electrode (specifically, near the four corners of the manifold back wall 20). In other words, the respective positions of the four RF connection points define the vertices of a geometric rectangle. This allows the relative phases of the RF power to be adjusted along both the X and Y axes so as to optimize the spatial uniformity of the plasma fabrication process performed in the plasma chamber along both the X and Y axes. (We use the term "X and Y axes" to mean any two orthogonal geometric dimensions on the surface of the electrode.)

The scope of the invention also contemplates a number of RF connection points greater than four, and a corresponding additional number of RF power supplies and phase shifters. This would provide even more detailed control over the the spatial uniformity of the plasma fabrication process, but it would complicate the experimental determination of the optimum phase shift value for each phase shifter.

Figure 3:
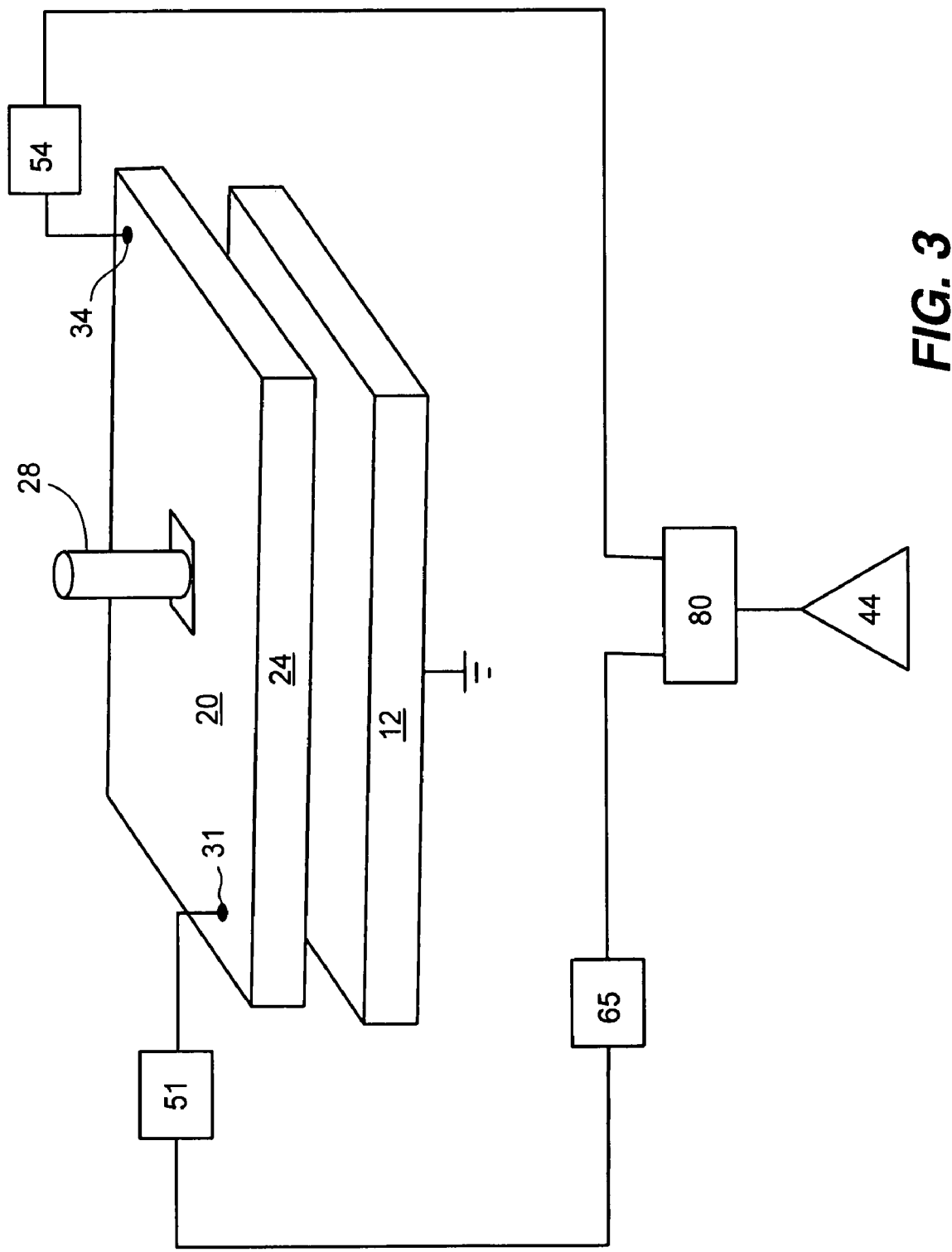
FIG. 3 is a schematic drawing of an alternative embodiment.

FIG. 3 shows an alternative embodiment having only two RF connection points 31, 34 near diagonally opposite corners of the electrode, specifically, diagonally opposite corners of the rear surface of the manifold back wall 20. Because the two RF connection points have different positions along both the X and Y axes of the rear surface of the manifold back wall, some control over the spatial uniformity of the plasma fabrication process is possible along both the X and Y axes. However, this embodiment does not permit the spatial uniformity along each axis to be controlled independently of the other axis as in the preferred embodiment of FIG. 2.

As in the embodiment of FIG. 2, an impedance matching network 51, 54 is connected between each RF connection point 31, 34 and its source of RF power. However, FIG. 3 illustrates a different means for providing RF power with different phase offsets at the different RF connection points 31, 34. The FIG. 3 embodiment has only a single, high power RF power supply 44. Its output is divided between the RF connection points by an RF power splitter 80. The phase offset between the RF connection points is controlled by a phase shifter 65 connected between the RF power splitter 80 and one of the impedance matching networks 53.

An advantage of the FIG. 3 embodiment is that it requires fewer RF components, but the FIG. 2 embodiment is advantageous in other respects.

One advantage of the FIG. 2 embodiment is that it avoids the need for a power splitter. In contrast, in the FIG. 3 embodiment the RF power splitter 80 must conduct the total RF power supplied to all the RF connection points. Some power loss in the RF power splitter is unavoidable, which will undesirably reduce the efficiency of power transfer from the RF power supply to the plasma chamber. Also, the RF power splitter can introduce some distortion in the RF waveform which can result in undesirable harmonics of the RF power supply signal being applied to the impedance matching networks 51, 54 and to the plasma within the chamber.

Another advantage of the FIG. 2 embodiment is that the phase shifters 61-63 are completely isolated from the load impedance of the plasma. The output of each phase shifter is connected to the sync input of its corresponding RF power supply 41-43. The sync input conventionally has a standard input impedance that is unaffected by the impedance of the load connected to the output of the RF power supply. The amount of phase shift produced by each phase shifter can be very accurate and consistent because it drives a standard, consistent load impedance.

In contrast, in the FIG. 3 embodiment the output of the phase shifter 65 is connected to the input of the impedance matching network 53. The impedance matching network typically does not completely eliminate changes in its input impedance in response to dynamic changes in the plasma within the plasma chamber during the course of performing a plasma fabrication process. Therefore, the amount of phase shift produced by the phase shifter could be inconsistent.

The electromagnetic field produced by the gas inlet manifold 20-26 or other electrode can be time-varying. Each of the phase shifters 61-63 can be a variable phase shifter whose amount of phase shift is varied over time in response to commands from a conventional programmable controller (not shown). The resulting time-averaged spatial uniformity of the plasma fabrication process can surpass the spatial uniformity at any particular instant in time.

In either of the embodiments of FIGS. 2 and 3, the optimum locations of the RF connection points 31-34 is a balance between two competing considerations. It is desirable to position the RF connection points as far from each other as possible, hence close to the corners of the manifold back wall 20, in order to maximize the electrical impedance between the RF connection points. However, if the RF connection points are too close to the edges of the manifold back wall, the load impedance presented to the impedance matching networks 51-54 will be capacitive rather than inductive. This would be undesirable because it would require each impedance matching network to include an inductor, which is more expensive and physically bulky than a capacitor, and variable inductors are more difficult to implement than variable capacitors.

The scope of the invention includes, but is not limited to, the following additional alternatives and modifications that are not illustrated in the drawings.

The components of each impedance matching network 51-54 can be physically dispersed. For example, each respective impedance matching network can include one or more reactances (i.e., capacitors and inductors) mounted physically adjacent to or within its respective RF power supply 41-44, and one or more additional reactances mounted physically adjacent to or directly on the electrode (for example, gas inlet manifold 20-26).

The illustrated gas inlet manifold 20-26 is rectangular because the illustrated plasma chamber is adapted for processing a rectangular workpiece 10. However, the invention is equally applicable to a plasma chamber for processing a circular workpiece that includes a circular gas inlet manifold or other circular electrode.

The illustrated manifold back wall 20 and showerhead 22 are not divided into segments, it may be desirable to do so. In that case, all references herein to "manifold back wall" and "electrode" encompass all segments collectively as a single manifold back wall or electrode.

Although the present invention primarily relates to the capacitively coupling RF power to the plasma, additional RF power may be coupled to the plasma by other means such as an induction coil or a microwave waveguide. Also, plasma generated in a remote plasma source may be flowed into the chamber interior through a gas inlet.

The invention claimed is:

1. A method of coupling RF power to a plasma chamber comprising the steps of:
   providing a plasma chamber comprising an electrode, wherein the electrode comprises first, second, third and fourth RF connection points;

providing first, second, third and fourth RF power supplies;
; and
respectively coupling a first, second, third and fourth RF power signal respectively outputted by the first, second, third and fourth RF power supply to the first, second, third and fourth RF connection points, respectively;
wherein:
each of the second, third and fourth RF power signals has the same frequency as the first RF power signal and a different non-zero phase offset relative to the first RF power signal;
the RF connection points are positioned on a two-dimensional surface of the electrode; and
the positions of the RF connection points are distributed along both dimensions of said surface.

2. The method of claim 1, further comprising the steps of:
supporting a workpiece within the plasma chamber;
providing a plasma within the plasma chamber; and
establishing the respective phase offset of each respective RF power signal other than said first RF power signal such that, in a region of the plasma chamber between the workpiece and the electrode, the plasma has a lower spatial non-uniformity than a plasma produced by each said phase offset being zero.

3. The method of claim 1, further comprising the steps of:
positioning a workpiece within the plasma chamber; and
performing a plasma process so as to form or modify a layer of material on the workpiece;
wherein the respective phase offset of each respective RF power signal other than said first RF power signal is established such that said layer of material resulting from said plasma process has a physical characteristic having a lower spatial non-uniformity than said physical characteristic of said layer of material that would have resulted from said plasma process if each said phase offset had been zero.

4. The method of claim 1, wherein:
each respective RF power supply includes a respective sync input and synchronizes its respective RF power signal in frequency and phase to an RF signal received at its respective sync input; and
the method further comprises the steps of:
producing an RF oscillator signal;
providing a plurality of phase shifters;
coupling the RF oscillator signal to an input of each phase shifter;
coupling the sync input of each respective RF power supply other than said first RF power supply to an output of a respective one of the phase shifters; and
coupling the sync input of the first RF power supply to the output of the RF oscillator.

5. The method of claim 4, further comprising the step of:
coupling a phase shifter between the output of the RF oscillator and the sync input of the first RF power supply.

6. A method of coupling RF power to a plasma chamber comprising the steps of:
providing a plasma chamber comprising an electrode, wherein the electrode comprises first, second, third and fourth RF connection points;
providing first, second, third and fourth RF power supplies; and
respectively coupling a first, second, third and fourth RF power signal respectively outputted by the first, second, third and fourth RF power supply to the first, second, third and fourth RF connection points, respectively;
wherein:
each of the second, third and fourth RF power signals has the same frequency as the first RF power signal and a different non-zero phase offset relative to the first RF power signal;
the RF connection points are positioned on a rectangular surface of the electrode; and
the positions of the RF connection points are distributed along both the X and Y axes of said rectangular surface.

7. The method of claim 1, wherein:
the electrode is a gas inlet manifold comprising a manifold back wall, a showerhead, and a suspension connecting the showerhead to the manifold back wall; and
the RF connection points are on the manifold back wall.

8. The method of claim 1, further comprising the steps of:
providing a plurality of impedance matching networks; and
coupling each respective impedance matching network between the output of a respective one of the RF power supplies and a respective one of the RF connection points.

9. The method of claim 4, wherein:
said plurality of phase shifters includes first, second and third phase shifters which respectively produce first, second and third time-varying phase shifts.

10. The method of claim 1, wherein:
the respective phase offset of the respective RF power signal outputted by the second, third and fourth power supply, respectively, is time-varying.

11. The method of claim 6, wherein:
the respective phase offset of the respective RF power signal outputted by the second, third and fourth power supply, respectively, is time-varying.

12. The method of claim 6, wherein:
said rectangular surface of the electrode includes first, second, third and fourth corners; and
the first, second, third and fourth RF connection points are positioned adjacent said first, second, third and fourth corners, respectively.

* * * * *